United States Patent [19]

Veenendaal

[11] 4,063,289
[45] Dec. 13, 1977

[54] CATHODE RAY TUBE MOUNTING MEANS INCLUDING LIGHTING MEANS AND CAMERA-CONNECTING MEANS

[75] Inventor: Cornelis Teunis Veenendaal, Cornelius, Oreg.

[73] Assignee: Tektronix, Inc., Beaverton, Oreg.

[21] Appl. No.: 743,017

[22] Filed: Nov. 18, 1976

[51] Int. Cl.² .............................................. H01J 9/00
[52] U.S. Cl. ................................. 358/242; 358/248; 358/254; 358/247; 313/462
[58] Field of Search .............. 358/245, 246, 247, 248, 358/249, 250, 254, 255, 242; 313/462

[56] References Cited
U.S. PATENT DOCUMENTS

| | | | |
|---|---|---|---|
| 2,673,342 | 3/1954 | Sims | 358/245 |
| 3,268,659 | 8/1966 | Gibsons | 358/250 |
| 3,281,618 | 10/1966 | Swedlund | 313/462 |
| 3,361,270 | 1/1968 | Swedlund | 313/462 |
| 3,683,225 | 8/1972 | Butler | 313/462 |
| 3,952,152 | 4/1976 | Lill | 358/248 |

Primary Examiner—Robert L. Griffin
Assistant Examiner—Edward L. Coles
Attorney, Agent, or Firm—Adrian John LaRue

[57] ABSTRACT

A cathode ray tube mounting means includes a front panel member having an opening through which a cathode ray tube is passed, and it has projections on its funnel section that mate with wedging members movably mounted in the panel member. A bezel having an implosion shield means therein is secured onto the front panel member and the wedging members are secured into position thereby moving the faceplate of the cathode ray tube into tight engagement with the implosion shield means. Lighting means is disposed between the front panel member and the bezel adjacent the faceplate to effectively light the graticule scale of the cathode ray tube screen and to permit easy replacement of light bulbs. A connecting means is also provided for electrically connecting a camera to the circuitry within the electronic instrument containing the cathode ray tube.

8 Claims, 6 Drawing Figures

CATHODE RAY TUBE MOUNTING MEANS INCLUDING LIGHTING MEANS AND CAMERA-CONNECTING MEANS

BACKGROUND OF THE INVENTION

Electrostatic cathode ray tubes are mounted in an electronic cabinet by mounting means at the faceplate and via clamp means that clamp onto the neck. The mounting means generally take the form of rubber or resilient members against which the corners of the CRT faceplate engage. The clamp means clamp onto the CRT neck and it is adjustable to align the faceplate with the bezel so that they are parallel. Such a mounting arrangement has created several problems. One problem is that if the CRT faceplate is not properly aligned and is not parallel with the bezel, photographs taken of the information displayed on the CRT screen by a camera removably mounted on the bezel will not provide an accurate photograph of such displayed information. Another problem is that the resilient mounting members may cause breakage of the faceplate when the instrument is dropped because the resilient mounting members reach their compressed condition at the same time that the resultant force of the instrument cabinet is occuring which substantially increases the forces on the CRT faceplate thereby breaking the faceplate if such forces are in excess of the strength of the faceplate. A further problem is the clamp means takes up room that could better be utilized to space components or to position more components therein.

U.S. Pat. Nos. 3,268,659; 3,281,618; 3,361,270 and 3,683,225 disclose lighting means for lighting internal graticule scale lines of a cathode ray tube. These lighting means are constructed in such a manner and mounted along or around the faceplate that it is very difficult to replace light bulbs, because, in some instruments, the light bulbs are soldered in position, and, in other instruments, it required removing the light guide member which has light bulbs secured therein. The arrangements make it difficult, time consuming and expensive to replace light bulbs.

SUMMARY OF THE PRESENT INVENTION

The present invention is directed to a mounting means and lighting means and more particularly to a cathode ray tube mounting means and lighting means for illuminating the graticule scale lines of a cathode ray tube.

The present invention is realized by the cathode ray tube having wedge-shaped projection means provided on the funnel section which mate with wedging members that are movably mounted in the wall delimiting the opening of the panel member through which the cathode ray tube is passed. A bezel member having an implosion shield means therein is secured onto the panel member with the implosion shield means in engagement with the faceplate of the cathode ray tube. Means connected to the wedging members and for moving the wedging members into tight engagement with the wedge-shaped projection means thereby forcing the cathode ray tube faceplate in tight engagement with the implosion shield means. A light bar is positioned between the panel member and the bezel member and is disposed adjacent an edge of the faceplate. A circuit board has light bulbs removably secured thereto and the circuit board is secured to the light bar through the bezel member and the light bulbs are disposed in respective openings in the light bar so that the light bulbs and light bar can illuminate the graticule scale of the cathode ray tube.

An object of the present invention is to provide a cathode ray tube mounting means.

Another object of the present invention is the provision of cathode ray tube mounting means wherein the cathode ray is mounted at its front end only.

A further object of the present invention is to provide a cathode ray tube mounting means that properly aligns the cathode ray tube faceplate with the benzel means so that accurate information can be photographed thereof.

An additional object of the present invention is the provision of a cathode ray tube mounting means that enables the cathode ray tube to be readily mounted securely in position and to properly align the faceplate of the cathode ray tube with bezel means.

A still further object of the present invention is to provide a graticule lighting means for illuminating the internal graticule scale of the cathode ray tube.

Still an additional object of the present invention is the provision of a graticule lighting means having light bulb means that are easily replaceable.

BRIEF DESCRIPTION OF THE DRAWINGS

Other objects and advantages of the present invention will become apparent from the following detailed description of preferred embodiments thereof and from the attached drawings of which.

DETAILED DESCRIPTION OF THE INVENTION

Figure 1:
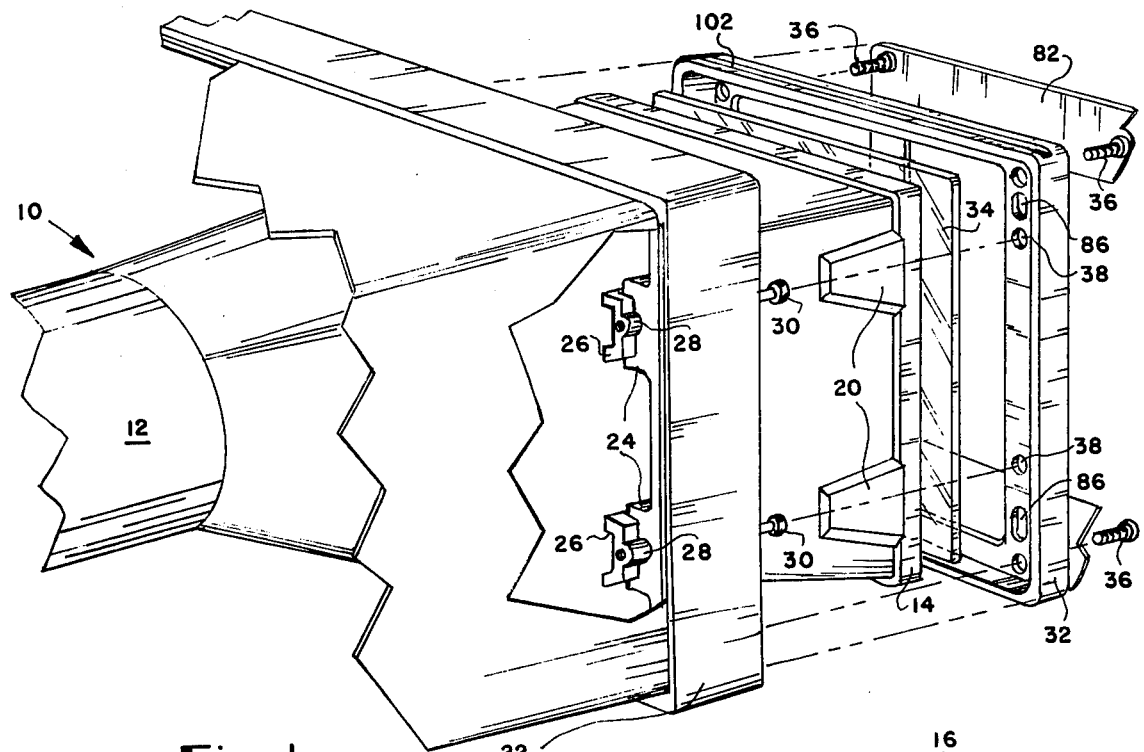
FIG. 1 is a perspective exploded view showing the cathode ray tube mounting arrangement.
Figure 2:
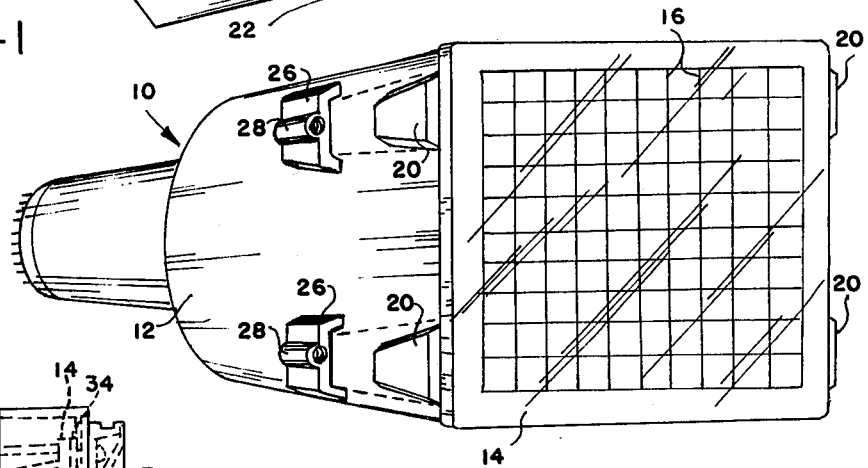
FIG. 2 is a perspective view showing the wedge-shaped projections on the funnel section of the cathode ray tube and the wedging members matable therewith.
Figure 3:
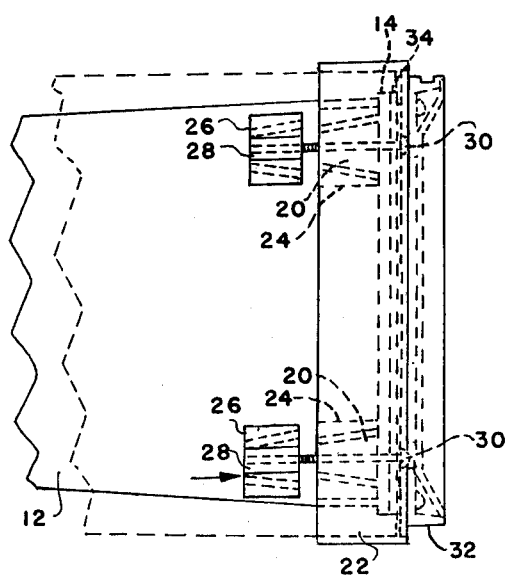
FIG. 3 is a side elevational view showing the cathode ray tube in a mounted position.
Figure 5:
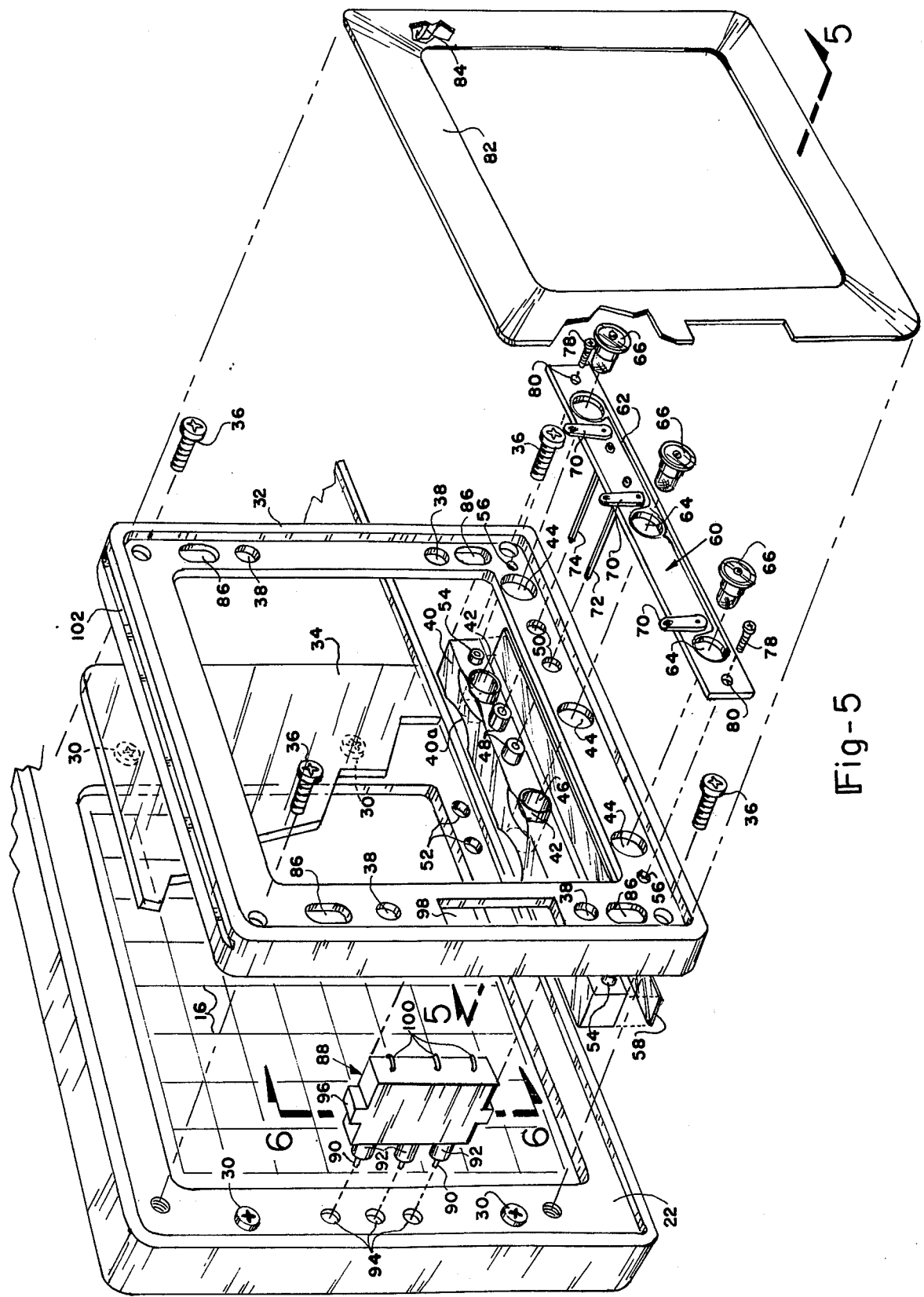
FIG. 5 is a part cross-sectional view taken along lines 5—5 of FIG. 4.

Turning now to FIGS. 1–3, a cathode ray tube 10 is preferably of the type disclosed in U.S. Pat. No. 3,207,936, but it can be any type of tube that will operate as required. Tube 10 has a ceramic funnel section 12 to the front end of which is frit sealed via frit 13 a flat faceplate 14 which is made of a suitable glass. A conventional graticule scale 16 is shown in FIG. 5 is generally in the form of intersecting lines of glass frit fused to the inner surface of faceplate 14 but they can be formed of light reflecting and diffusing material such as titanium dioxide deposited on the inside surface of the faceplate or by grooves that are etched or scribed into such rear surface as disclosed in U.S. Pat. Nos. 3,683,225; 3,361,270; 3,281,618 and 3,268,659. A conventional phosphor layer 18 is deposited or coated over graticule scale 16 along the inner surface of faceplate 14 and it may function as a conventional phosphor screen, or it may also operate as a storage dielectric of a direct-viewing bistable storage tube of the type disclosed in U.S. Pat. No. 3,214,631 in which case a thin light transparent conductive layer of tin oxide (not shown) is provided beneath the phosphor layer. Of course, even when phosphor layer 18 functions as a storage dielectric, it can also operate as a conventional phosphor viewing screen for emitting a light image of the charge image stored on such dielectric.

Funnel section 12 has wedge-shaped projections 20 thereon and these projections can be formed as part of funnel section 12 or they can be secured onto funnel section 12 by use of a suitable adhering material such as for example an epoxy resin. The funnel section can be made from glass if desired. Projections 20 are located adjacent the front end of the funnel section so that a faceplate 14 is also frit sealed to projections 20 as well as the front edge of the funnel section.

Front casting 22 has an opening through which the cathode ray tube 10 is introduced into the cabinet. U-shaped guides 24 are provided by opposing inside surfaces delimiting the opening in casting 22. The inside surface of guides 24 conform to the exterior surface of wedging members 26 which are slidably mounted therein. Radiussed projection 28 is provided by wedging members 26 which have a screw 30 threadably disposed therein. The inside surface of wedging members 26 has a wedge shape for matable engagement with respective projections 20. Wedging members 26 are preferably molded from a suitable plastic material such as for example plastic material marketed under the trademark DELRIN.

A bezel 32 is a transparent implosion shield 34 therein and bezel 32 is secured onto casting 22 via screws 36. After bezel 32 has been secured onto casting 22, screws 30 are tightened through openings 38 in bezel 32 in alignment with screws 30 thereby causing wedging members 26 to move along guide members 24 and along projections 20 whereby faceplate 14 is moved into tight engagement with implosion shield 34 through the action of wedging members 26 on projections 20. The cathode ray tube is now tightly and securely mounted in position on casting 22 at the front end of the cathode ray tube. Such action places the faceplate parallel with the bezel so that proper alignment takes place and photographs taken of information displayed on the screen will be accurate. Casting 22 is secured to corner mounting members of the type disclosed in U.S. patent application Ser. No. 743,016, filed Nov. 18, 1976 (PF 2394) which forms a frame that will result in an electronic cabinet for housing a cathode ray tube and associated electronic circuitry. If the cathode ray tube needs to be replaced, it can readily be done by removing the bezel and loosening screws 30. The plastic wedging members 26 serve as shock absorbers if the instrument is subjected to undue shock.

Figure 4:
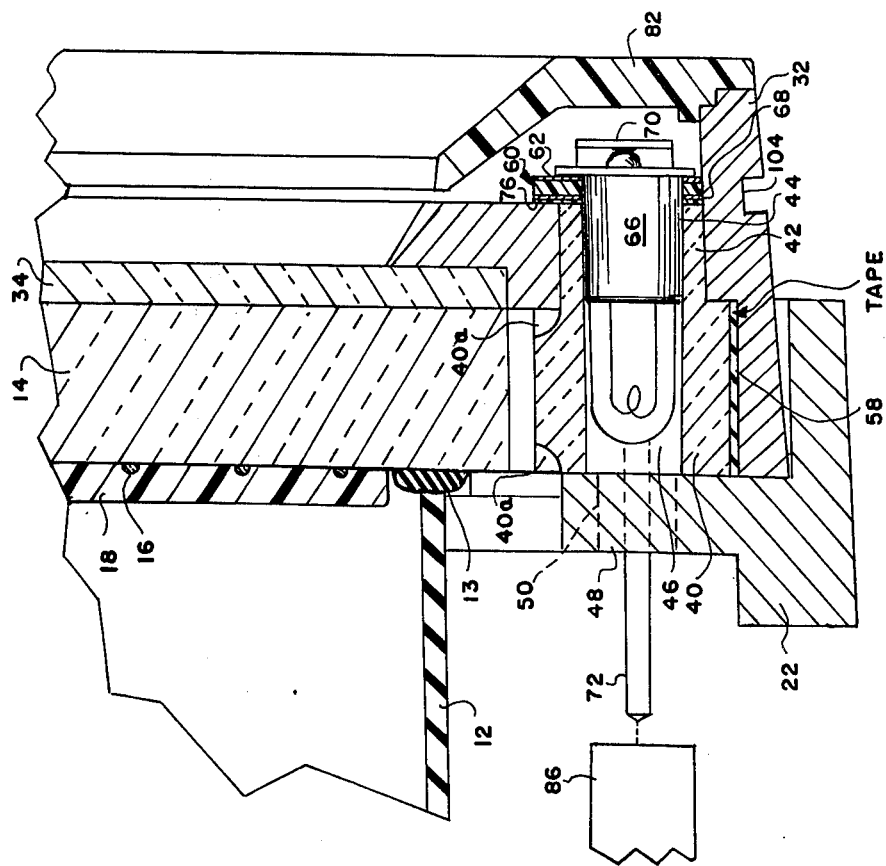
FIG. 4 is a perspective exploded view showing the lighting means and camera-connecting means.
Figure 6:
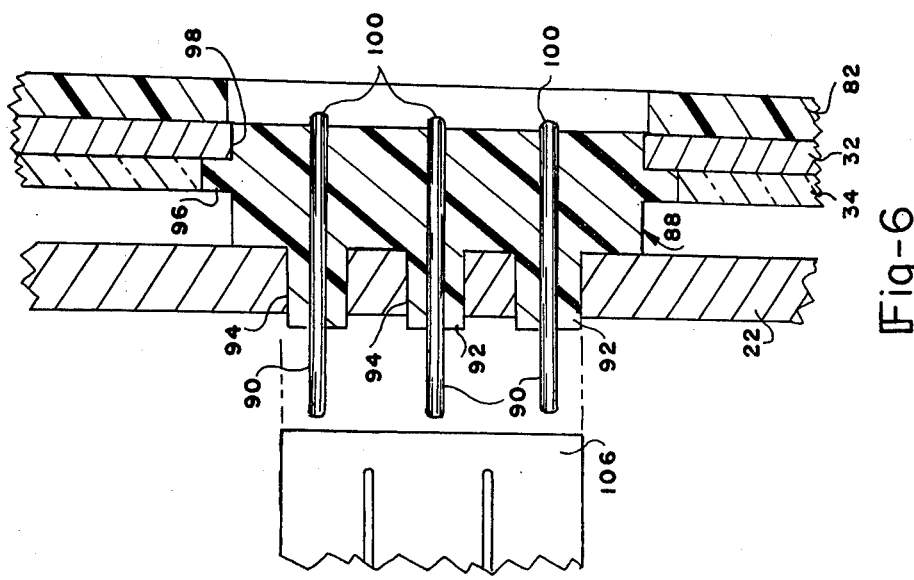
FIG. 6 is a part cross-sectional view taken along lines 6—6 of FIG. 4.

Turning now to FIGS. 4-6, a graticule lighting means is illustrated. A light guide 40 is preferably molded from a suitable plastic material such as methyl methacrylate and it includes projections 42 that mate with holes 44 in bezel 32. Holes 46 extend through projections 42 and light guide 40. Projections 48 extend outwardly from both sides of light guide 40 and mate with holes 50 and 52 in bezel 32 and casting 22 respectively; whereas projections 54 mate with holes 56 in bezel 32. A white tape 58 is adhered onto the bottom of light guide 40 and a white tape (not shown) is adhered onto the sides and top of faceplate 14.

A printed circuit board 60 has a circuit path 62 located on an outer surface which surrounds openings 64 and which make electrical contact with an outer terminal of light bulbs 66. Another circuit path 68 (FIG. 5) is provided on the inner surface of circuit board 60, and it is connected to contact members 70 which are pivotally mounted on the circuit board to enable light bulbs 66 to be inserted into openings 64 when they are in the position shown in FIG. 4 and they are then moved into engagement with the inner terminals of light bulbs 66 as shown in FIG. 5 to provide electrical contact thereto and to maintain light bulbs 66 in position. Circuit paths 62 and 68 are connected respectively to electrical terminal pins 72 and 74.

In assembly and before bezel 32 is secured onto front casting 22, light guide 40 is positioned on a bottom inner surface of bezel 32 with projections 42, 48 and 54 extending through holes 44, 50 and 56, respectively. A thin strip of insulating material 76 having holes therethrough that mate with holes 44, 50 and 56 is positioned onto the bottom outer surface of benzel 32 whereafter circuit board 60 is positioned in engagement with insulating strip 76 with terminal posts 72 and 74 extending through holes in projections 48. Screws 78 are then passed through holes 80 in circuit board 60 and threadably engage holes in projections 54 thereby securing light guide 40 and circuit board 60 in position on the bottom inner and outer surfaces respectively of bezel 32. Bezel 32 with implosion shield 34 in position therein can now be secured to front casting 22 via screws 36 with projections 48 extending through holes 52 in front casting 22. Screws 30 are then tightened through holes 38 thereby securing the cathode ray tube in position against the implosion shield via wedging members 26 and projections 20 as described hereinbefore.

Arcuate depressions 40a are provided in the upper edges of light guide 40 in alignment with holes 46 to restrict the area where the light is transmitted from light guide 40 into the faceplate to illuminate the internal graticule 16 in order to eliminate light spots that would be created by the filaments of light bulbs 66.

A cover 82, which is preferably molded from a suitable plastic material, is provided with integral spring latches 84 which mate with oblong openings 86 in bezel 32 thereby latachably maintaining cover 82 in position. A filter (not shown) can be positioned in cover 82 and held in position against bezel 32 by cover 82 to filter out any undesired light. Cover 82 can be removed and this permits ready replacement of burned out bulbs 66.

An electrical connector assembly 86 including an insulating housing and electrical receptacles therein is connected to terminal pins 72 and 74 to provide electrical potential to light bulbs 66.

A camera-connecting means can also be provided as shown in FIGS. 4 and 6. An insulating contact carrier 88 is molded from a suitable dielectric material with pins 90 in position therein at spaced intervals. Annular projections 92 surrounding part of pins 90 are provided by carrier 88 and they mate with holes 94 located in the middle of the left side of front casting 22 so that projections 92 insulate pins 90 from casting 22 and carrier 88 abuts thereagainst. A flange 96 is provided on the top, bottom and inner side of carrier 88 and it abuts against bezel 32 which permits the front section of carrier 88 to extend through rectangular opening 98 in the middle of the left side of bezel 32. Bezel 32 maintains carrier 88 in position when it is secured onto casting 22. Pins 90 have right-angled contact sections 100 that extend along the top surface of carrier 88 to provide electrical power to an oscilloscope camera (not shown) of the type disclosed in U.S. Pat. No. 3,149,903 which is mounted in position on bezel 32 via grooves 102 and 104. An electrical connector assembly 106 similar to connector assembly 86 makes electrical connection with pins 90 to provide electrical potential thereto. Electrical connector assemblies 86 and 106 can be of the type disclosed in U.S. Pat. No. Re28,147.

As can be discerned from the foregoing, there has been disclosed a cathode ray tube mounting arrangement that enables easy and accurate mounting of a cathode ray tube in position in an electronic cabinet so that the cathode ray tube is properly aligned and to enable fast and easy replacement of the CRT when necessary. Also disclosed is a graticule lighting arrangement that enables the elements of the graticule lighting arrangement to be easily and readily mounted in position and to permit easy replacement of burned out light bulbs.

It will be obvious to those knowledgeable of the particular art to which this invention pertains that many changes may be made in details of the above-described embodiments of the present invention without departing from the spirit thereof. Therefore, the scope of the present invention is to be determined by the following claims.

The invention is claimed in accordance with the following:

1. A cathode ray tube mounting means for mounting a cathode ray tube having projection means thereon in position in an electronic cabinet, comprising:
    a front casting having an opening therethrough and through which the cathode ray tube is moved;
    guide means provided by said front casting adjacent said opening;
    movable means movably disposed in said guide means for matable engagement with the projection means when the cathode ray tube is moved through said opening;
    bezel means having implosion shield means therein securable onto said front casting; and
    means provided by said movable means and engageable through said bezel means to move said movable means along said guide means thereby moving a faceplate of the cathode ray tube against said implosion shield means.

2. A cathode ray tube mounting means according to claim 1 wherein the projections on the cathode ray tube are wedge-shaped and said movable means have inner surfaces defining a wedge configuration.

3. A cathode ray tube mounting means according to claim 1 wherein lighting means is mounted on said bezel means for disposition against an edge of the cathode ray tube faceplate to illuminate a graticule scale provided on the faceplate.

4. A cathode ray tube mounting means according to claim 3 wherein said lighting means includes a light guide having light bulb means removably mounted therein which are replaceable from the front of the cabinet.

5. Lighting means for illuminating internal graticule lines on a surface of a cathode ray tube faceplate comprising:
    front casting means including mounting means for removably mounting a cathode ray tube thereon;
    bezel means surrounding the cathode ray tube faceplate and being mounted on said front casting means;
    light guide means extending along an edge of the faceplate and having spaced openings therein;
    means securing said light guide means onto said bezel means and including holes therethrough and through said bezel means in alignment with said spaced openings respectively;
    light bulb means disposed in said holes and spaced openings;
    conductive means provided on said securing means electrically engaging respective terminals of said light bulb means; and
    means connected to said conductive means for providing electrical potential thereto to energize said light bulb means.

6. Light means according to claim 5 whereas said conductive means includes contact means pivotally mounted on said securing means for electrical engagement with inner terminals of said light bulb means to maintain said light bulb means in position in said spaced openings and to maintain outer terminals of said light bulb means in electrical engagement with conductive path means provided by said securing means, said pivotal contact means permitting easy replacement of said light bulb means.

7. Lighting means according to claim 5 wherein arcuate-shaped depressions are provided in upper edges of said light guide means in alignment with said spaced openings to restrict the area through which the light from said light bulb means is transmitted into the faceplate.

8. Lighting means according to claim 5 wherein reflective means is disposed along a bottom surface of said light guide means.

* * * * *

UNITED STATES PATENT AND TRADEMARK OFFICE
CERTIFICATE OF CORRECTION

PATENT NO. : 4,063,289
DATED : December 13, 1977
INVENTOR(S) : CORNELIUS T. VEENENDAAL It is certified that error appears in the above-identified patent and that said Letters Patent are hereby corrected as shown below:

Change "Fig. 5" to --Fig. 4--.
Change "Fig. 4" to --Fig. 5--.

Signed and Sealed this

Twenty-fourth Day of October 1978

[SEAL]

Attest:

RUTH C. MASON
Attesting Officer

DONALD W. BANNER
Commissioner of Patents and Trademarks